United States Patent
Kryskowski

(10) Patent No.: US 8,803,127 B2
(45) Date of Patent: Aug. 12, 2014

(54) SUPERLATTICE QUANTUM WELL INFRARED DETECTOR

(75) Inventor: David Kryskowski, Ann Arbor, MI (US)

(73) Assignee: UD Holdings, LLC, Dearborn Heights, MI (US)

( * ) Notice: Subject to any disclaimer, the term of this patent is extended or adjusted under 35 U.S.C. 154(b) by 0 days.

(21) Appl. No.: 13/825,864

(22) PCT Filed: Oct. 7, 2011

(86) PCT No.: PCT/US2011/055220
§ 371 (c)(1),
(2), (4) Date: Mar. 25, 2013

(87) PCT Pub. No.: WO2012/051060
PCT Pub. Date: Apr. 19, 2012

(65) Prior Publication Data
US 2013/0299781 A1 Nov. 14, 2013

Related U.S. Application Data

(60) Provisional application No. 61/391,996, filed on Oct. 11, 2010.

(51) Int. Cl.
*H01L 29/06* (2006.01)
*G01R 31/26* (2014.01)
*H01L 21/00* (2006.01)

(52) U.S. Cl.
USPC ............... 257/14; 257/15; 438/14; 438/48; 438/57

(58) Field of Classification Search
USPC .......... 438/14, 15, 22, 46–48, 56, 57; 257/14, 257/15, 19, 21, 186
See application file for complete search history.

(56) References Cited

U.S. PATENT DOCUMENTS

| 4,895,790 A | 1/1990 | Swanson et al. |
| 5,436,476 A | 7/1995 | Hynecek |

(Continued)

FOREIGN PATENT DOCUMENTS

EP 2138817 A1 12/2009

OTHER PUBLICATIONS

Ghamaty et al., "Si/SiGe Quantum Well Thermoelectric Materials and Devices for Waste Heat Recovery From Vehicles and Industrial Plants", International Symposium on Nano-Thermoelectrics, 2007, pp. 1-5.

(Continued)

*Primary Examiner* — Hsien Ming Lee
(74) *Attorney, Agent, or Firm* — Brooks Kushman P.C.

(57) ABSTRACT

In at least one embodiment, an infrared (IR) sensor comprising a thermopile is provided. The thermopile comprises a substrate and an absorber. The absorber is positioned above the substrate and a gap is formed between the absorber and the substrate. The absorber receives IR from a scene and generates an electrical output indicative of a temperature of the scene. The absorber is formed of a super lattice quantum well structure such that the absorber is thermally isolated from the substrate. In another embodiment, a method for forming an infrared (IR) detector is provided. The method comprises forming a substrate and forming an absorber with a plurality of alternating first and second layers with a super lattice quantum well structure. The method further comprises positioning the absorber about the substrate such that a gap is formed to cause the absorber to be suspended about the substrate.

28 Claims, 12 Drawing Sheets

(56) References Cited

U.S. PATENT DOCUMENTS

| | | | |
|---|---|---|---|
| 5,550,387 | A | 8/1996 | Elsner et al. |
| 5,773,831 | A | 6/1998 | Brouns |
| 6,060,656 | A | 5/2000 | Dresselhaus et al. |
| 6,292,089 | B1 | 9/2001 | Andersson |
| 6,331,445 | B1* | 12/2001 | Janz et al. ............... 438/57 |
| 6,355,939 | B1 | 3/2002 | Dodd |
| 6,664,639 | B2 | 12/2003 | Cleeves |
| 6,690,014 | B1 | 2/2004 | Gooch et al. |
| 7,038,234 | B2 | 5/2006 | Ghamaty et al. |
| 7,755,048 | B2 | 7/2010 | Hsu |
| 7,786,469 | B2* | 8/2010 | Maa et al. ............... 257/19 |
| 8,253,211 | B2* | 8/2012 | Cheng et al. ............ 257/431 |
| 2004/0140531 | A1* | 7/2004 | Werner et al. ........... 257/616 |
| 2005/0040388 | A1 | 2/2005 | Ghamaty et al. |
| 2008/0073733 | A1* | 3/2008 | Kudo et al. ............. 257/412 |
| 2010/0031992 | A1 | 2/2010 | Hsu |
| 2010/0133536 | A1 | 6/2010 | Syllaios et al. |
| 2011/0168978 | A1 | 7/2011 | Kochergin |

OTHER PUBLICATIONS

Elsner, "2009 DOE Hydrogen Program High Temperature Thermoelectric Materials", Hi-Z Technology, Mar. 20, 2009, 44 pages.
Lenggenhager et al., "Thermoelectric infrared sensors in CMOS technology", Sensors and Actuators A, 37-38, 1993, pp. 216-220.
Niklaus et al., "MEMS-Based Uncooled Infrared Bolometer Arrays—A Review", Proceedings of SPIE, vol. 6836, 2007, 15 pages.
Kuntner et al., "Determining the thin-film thermal conductivity of low temperature PECVD silicon nitride", Institute of Sensor and Actuator Systems, Vienna University of Technology, Vienna, Austria, 2006, 4 pages.
Balandin et al., "Effect of phonon cononement on the thermoelectric figure of merit of quantum wells", Journal of Applied Physics, vol. 84, No. 11, Dec. 1, 1998, pp. 6149-6153.
Kathman et al., "Efficiency considerations for diffractive optical elements", SPIE, Vo. 2577, Feb. 8, 2010, pp. 114-122.
Miyazaki et al., "Flash Evaporated Thin Films of Bismuth Telluride", IEEE, International Conference on Thermoelectrics, 2006, 5 pages.
Lee et al., "Heat transport in thin dielectric films", J. Appl. Phys., vol. 81, No. 6, Mar. 15, 1997, pp. 2590-2595.
Foote et al., "High performance micromachined thermopile linear arrays", Proceedings of SPIE 3379, 1998, 6 pages.
Carmo et al., "Improved p- and n-type thin-film microstructures for thermoelectricity", Electronics Letters, vol. 45, No. 15, Jul. 16, 2009, 2 pages.
Strasser et al., "Miniaturized thermoelectric generators based on poly-Si and poly-SiGe surface micromachining", Sensors and Actuators (3179)A, 2002, pp. 535-542.
Ichino et al., "Improvement of thermoelectric properties by introducing nanostructures into Bi2Te3 thin films", IEEE, 2007, 4 pages.
Morgan et al., "Patterning of Bi2Te3 Polycrystalline Thin-Films on Silicon", Army Research Laboratory, Jan. 2008, 18 pages.
Foote et al., "Progress Towards High-Performance Thermopile Imaging Arrays", Proceedings of SPIE 4369, 2001, 5 pages.
Horn et al., "Reaching for the sensitivity limits of uncooled and minimally-cooled thermal and photon infrared detectors", Infrared Technology and Applications XXXI, Proc. of SPIE, vol. 5783, 2005, pp. 401-411.
Schieferdecker et al., "Infrared thermopile sensors with high sensitivity and very low temperature coefficient", Sensors and Actuators A 29, 1995, pp. 422-427.
Foucaran et al., "Flash evaporated layers of (Bi2Te3-Bi2Se3)(N) and (Bi2Te3-Sb2Te3)(P)", Materials Science and Engineering B52, 1998, pp. 154-161.
Wijngaards et al., "Thermo Electric Characterization of APCVD PolySi0.7 Ge0.3 for IC-Compatible Fabrication of Integrated Lateral Peltier Elements", IEEE Transactions on Electron Devices, vol. 52, No. 5, May 2005, pp. 1014-1025.
Hanson, "Uncooled IR detector performance limits and barriers", Proceedings of SPIE, vol. 4028, 2000, pp. 2-11.
Goncalves et al., "Optimization of thermoelectric properties on Bi2Te3 thin films deposited by thermal co-evaporation", Thin Solid Films, 2009, 6 pages.
Venkatasubramanian et al., "In-Plane Thermoelectric Properties of Freestanding Si/Ge Superlattice Structures", IEEE, 1998, pp. 191-197.
Schumann et al., "Micromachined thermoelectric test device based on Silicon/Germanium superlattices: Simulation, preparation, and characterization of thermoelectric behavior", IEEE, 2003, pp. 677-681.
International Preliminary Report on Patentability for corresponding Application No. PCT/US11/55220, mailed Feb. 26, 2013, 20 pages.
International Search Report and Written Opinion for corresponding Application No. PCT/US2011/055220, mailed Apr. 30, 2012, 11 pages.
Hicks et al., "Effect of quantum-well structures on the thermoelectric figure of merit", The American Physical Society, vol. 47, No. 19, May 15, 1993, pp. 727-731.
Lee et al., "Thermal conductivity of Si-Ge superlattices", Applied Physics Letter, 70, 2957, Jun. 2, 1997, 4 pages.
Koga et al., "Carrier pocket engineering applied to "strained" Si/Ge superlattices to design useful thermoelectric materials", Applied Physics Letter, 75, 2438, Oct. 18, 1999, 4 pages.
Harman et al., "High Thermoelectric Figures of Merit in PbTe Quantum Wells", Journal of Electronic Materials, vol. 25, No. 7, Jan. 1996, pp. 1121-1127.
Chinese Office Action for corresponding Application No. 201180057683.9, mailed Jan. 21, 2014, 7 pages.

* cited by examiner

A

SUPERLATTICE QUANTUM WELL INFRARED DETECTOR

CROSS-REFERENCE TO RELATED APPLICATIONS

This application is a U.S. national phase of PCT Application No. PCT/US2011/055220 filed Oct. 7, 2011 which claims the benefit of U.S. provisional Application Ser. No. 61/391,996 filed Oct. 11, 2010, the disclosures of which are incorporated in their entirety by reference herein.

BACKGROUND

1. Technical Field

Embodiments described herein generally relate to a superlattice quantum well infrared (IR) detector (or sensor) and to a method of forming the same.

2. Background Art

An IR detector is generally defined as a photodetector that responds to IR radiation. One type of an infrared detector is a thermal based detector. A thermal based detector may be implemented within a camera to generate an image of an object formed on the thermal properties generally associated with such an object. Thermal based detectors are known to include bolometers, microbolometers, pyroelectric, and thermopiles.

A microbolometer changes its electrical resistance based on an amount of radiant energy that is received from an object. Thermopiles include a number of thermocouples that convert thermal energy from the object into electrical energy. Such devices have been incorporated into cameras in one form or another for thermal imaging purposes. The following references may be relevant to the present disclosure: U.S. Pat. No. 5,436,476 to Hynecek, U.S. Pat. No. 5,550,387 to Elsner et al., U.S. Pat. No. 6,060,656 to Dresselhaus, et al., U.S. Pat. No. 6,690,014 to Gooch, et al., U.S. Pat. No. 7,038,234 to Ghamaty, et al., U.S. Pat. No. 7,755,048 to Hsu, and U.S. Patent Publication No. 2011/0168978 to Kochergin.

SUMMARY

In at least one embodiment, an infrared (IR) sensor comprising a thermopile is provided. The thermopile comprises a substrate and an absorber. The absorber is positioned above the substrate and a gap is formed between the absorber and the substrate. The absorber receives IR from a scene and generates an electrical output indicative of a temperature of the scene. The absorber is formed of a super lattice quantum well structure such that the absorber is thermally isolated from the substrate. In another embodiment, a method for forming an infrared (IR) detector is provided. The method comprises forming a substrate and forming an absorber with a plurality of alternating first and second layers with a super lattice quantum well structure. The method further comprises positioning the absorber about the substrate such that a gap is formed to cause the absorber to be suspended about the substrate.

BRIEF DESCRIPTION OF THE DRAWINGS

The embodiments of the present invention are pointed out with particularity in the appended claims. However, other features of the various embodiments will become more apparent and will be best understood by referring to the following detailed description in conjunction with the accompany drawings in which:

DETAILED DESCRIPTION

Figure 1:
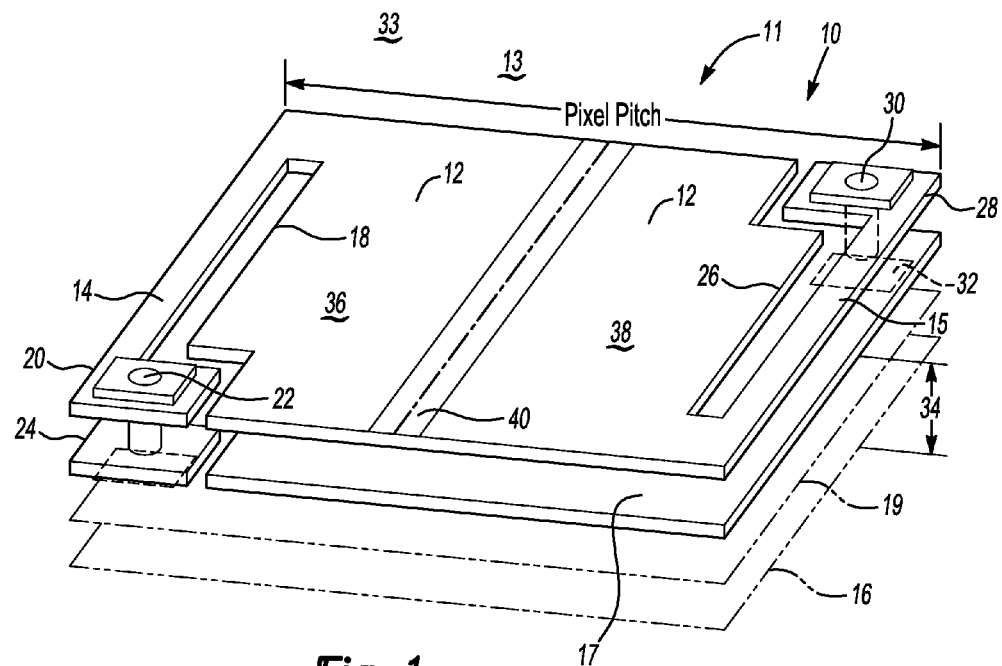
FIG. 1 depicts a thermal detector in accordance to one embodiment of the present invention.

Detailed embodiments of the present invention are disclosed herein. However, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the one or more embodiments of the present invention.

Various embodiments as disclosed herein, generally provide for, but not limited to, a plurality of IR detectors that may be positioned in an array of M×N columns for generating an image of a scene. In another embodiment, the plurality of IR detectors may be used to capture (or sense) thermal energy from a light source (or scene) and to provide an electrical output based on the sensed thermal energy for purposes of energy storage. In another embodiment, a single IR detector may be provided for thermal sensing. The IR detector generally includes, among other things, an absorber, a substrate, and/or at least one arm. The absorber and/or the at least one arm may be suspended over the substrate. It is contemplated that the absorber and/or the at least one arm may be constructed of a superlattice quantum well thermoelectric based material. Such a construction may enable the absorber and the at least one arm to achieve increased Seebeck effect, low resistivity, and adequate thermal conductivity. These aspects may improve detector performance. It is also contemplated that the absorber and/or the arm may be encapsulated by, but not limited to, various silicon based dielectric materials such as silicon nitride and/or silicon dioxide. The encapsulation of the superlattice quantum well thermoelectric materials with the silicon based dielectric materials may stress compensate the detector and may increase the structural integrity of the detector while the absorber and/or the at least one arm are suspended over the substrate.

It is contemplated that the embodiments described herein may be utilized for purposes other than those described and that the challenges that may be noted herein are not intended to be an exhaustive list of challenges that may be overcome by the embodiments of the present invention. Such challenges that may be described herein are noted for illustrative purposes and that all of the challenges that may be overcome by the various embodiments of the present invention are not described for purposes of brevity. Moreover, it is contemplated that the embodiments described herein may provide for any number of results and that those noted are not intended to be an exhaustive list that may be achieved. Such results disclosed herein are noted for illustrative purposes and that all of the results achieved by the embodiments of the present invention are not described for purposes of brevity as well. Furthermore, the examples provided herein are disclosed for illustrative purposes and are not intended to be an exhaustive list of examples that are capable of being implemented and are not intended to limit the scope of the embodiments of the present invention in any manner.

FIG. 1 depicts a thermal detector (or sensor) 10 in accordance to one embodiment of the present invention. The detector 10 may be one of many arranged in an M×N array 18 within a camera 11 that includes a lens 13. The camera 11 is generally configured to capture an image of a scene. Each detector 10 is configured to absorb IR radiation from a scene and to change its voltage potential based on the amount of energy received from the scene. A readout integrated circuit (ROIC) 19 (or readout circuit) is positioned below each detector 10. The ROIC 19 may electrically output the voltage potential for each detector 10. Each detector 10 may be micro-machined on top of the ROIC 19. The embodiments disclosed herein may be incorporated in a detector as set forth in co-pending application Serial No. PCT/US2010/028293 ("the '293 application"), entitled "INFRARED DETECTOR" filed on Mar. 23, 2010, which is hereby incorporated by reference in its entirety. The detector 10 is generally arranged as a micro-bridge. The detector 10 may be formed as a thermopile.

While the detector 10 as noted above may be used to capture an image of a scene in a camera, it is further contemplated that the detector 10 may be used to sense thermal energy from a light source (or scene), such as thermal energy received directly or indirectly from the sun. The detector 10 provides a voltage output in response to the thermal energy for providing electrical energy to power another device or for storing electrical energy on a storage device such as a battery or other suitable mechanism.

The detector 10 includes an absorber 12, a first arm 14, a second arm 15, and a substrate 16. The absorber 12, the first arm 14, and the second arm 15 may comprise thermoelectric materials and be formed with superlattice quantum well materials which will be described in more detail below. The substrate 16 may comprise, but not limited to, a monocrystalline silicon wafer or a silicon wafer. The substrate 16 may be connected to the ROIC 19. The absorber 12, the first arm 14, and the second arm 15 are generally suspended over the ROIC 19. The first arm 14 is positioned next to the absorber 12 and may extend, if desired (attached or unattached) along a first side 18 of the absorber 12 and terminate at a terminal end 20. A post 22 is coupled to the terminal end 20 of the first arm 14.

An input pad 24 of the ROIC 19 receives the post 22. The post 22 provides an electrical connection from the absorber 12 to the ROIC 19. In a similar manner, the second arm 15 is positioned next to the absorber 12 and may extend, if desired (attached or unattached) along a second side 26 of the absorber 12 and terminate at a terminal end 28. A post 30 is coupled to the terminal end 28 of the second arm 16. An input pad 32 of the ROIC 19 receives the post 30. The post 30 provides an electrical connection from the absorber 12 to the ROIC 19. In general, the posts 22 and 30 cooperate with one another to support the absorber 12, the first arm 14, and the second arm 15 above the substrate 16 (e.g., suspend the absorber 12, the first arm 14, and the second arm 15 above the substrate 16).

The absorber 12 is generally configured to receive (or absorb) IR radiation from a scene and to change temperature in response thereto. The detector 10 may change its voltage potential based on the amount of radiation received from the scene. A reflector 17 is positioned between the absorber 12 and the ROIC 19. The reflector 17 may enhance the ability for the absorber 12 to absorb the IR radiation. The first arm 14 and the second arm 15 may be horizontally displaced from the absorber 12 to thermally isolate the absorber 12. It may be desirable to reduce thermal conduction to increase detector 10 performance. In addition, the absorber 12, first arm 14, and the second arm 15 may be vertically displaced from the substrate 16 and define an isolation gap 34 (or cavity) therebetween for thermally isolating one detector from additional detectors positioned within the array.

The detector 10 may comprise P-type materials on one side and N-type materials on another side. For example, the absorber 12 may be considered to include a first portion 36, a second portion 38, and an active region 40. The first arm 14 and the first portion 36 may be constructed from P-type materials. The second arm 15 and the second portion 38 may be constructed from N-type materials. The active region 40 electrically couples the P-type based elements (first arm 14 and the first portion 36) to the N-type based elements (second arm 15 and the second portion 38).

Figure 2:
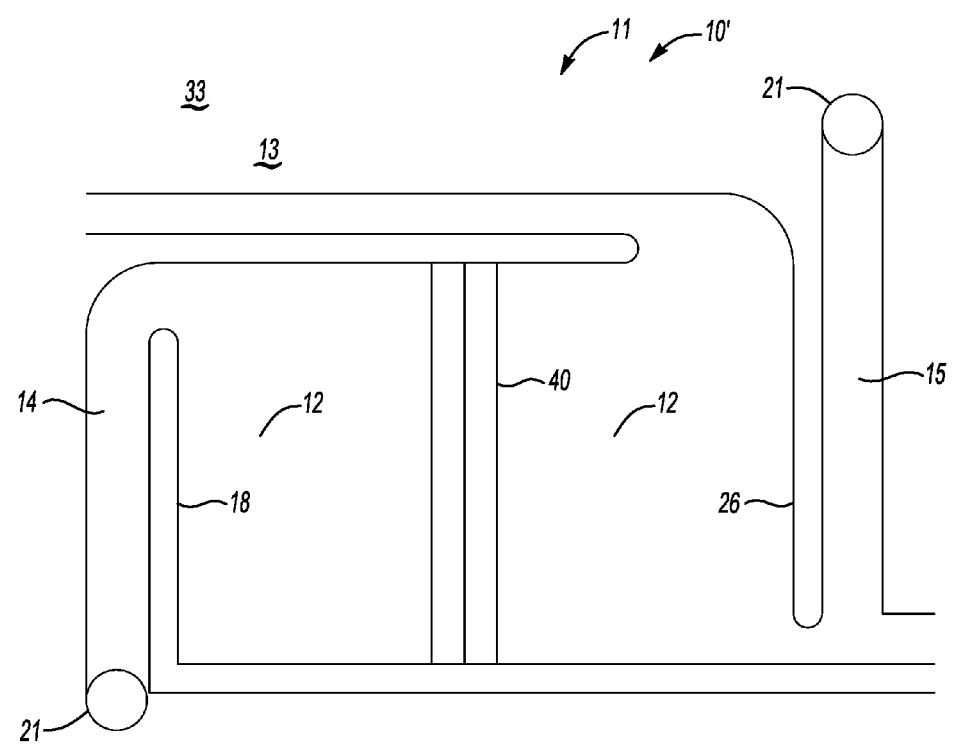
FIG. 2 depicts a thermal detector in accordance to another embodiment of the present invention.

FIG. 2 depicts a thermal detector 10' in accordance to another embodiment of the present invention. The detector 10' may be one of many arranged in an M×N array 18 within the camera 11 that includes a lens 13. The detector 10' is generally similar to the detector 10 of FIG. 1, but is surface-micro-machined.

The detector 10' is configured to absorb IR radiation from a scene and to change a voltage potential thereof based on amount of energy received from the scene. An electrical connection 21 is formed on each side of the detector 10' for providing an electrical output therefrom to a readout circuit (not shown). The detector 10' may also be incorporated as a detector as set forth in the '293 application.

The detector 10' includes the absorber, first arm 14, the second arm 15 and the substrate 16. The absorber 12, the first arm 14 and the second arm 15 may comprise thermoelectric materials and are formed with superlattice quantum well materials which will also be described in more detail below. The substrate 16 may comprise, but not limited to, a monocrystalline silicon wafer or silicon wafer. The absorber 12, the first arm 14 and the second arm 15 are generally positioned (or suspended) over a cavity 25 (see FIG. 3). In a similar manner to that described above, the first arm 14 may extend, if desired (attached or unattached), along the first side 18 of the absorber 12 and reach the electrical connection 21. The second arm 16 may extend, if desired (attached or unattached), along the second side 26 of the absorber 12 and reach the electrical connection 21.

Figure 3:
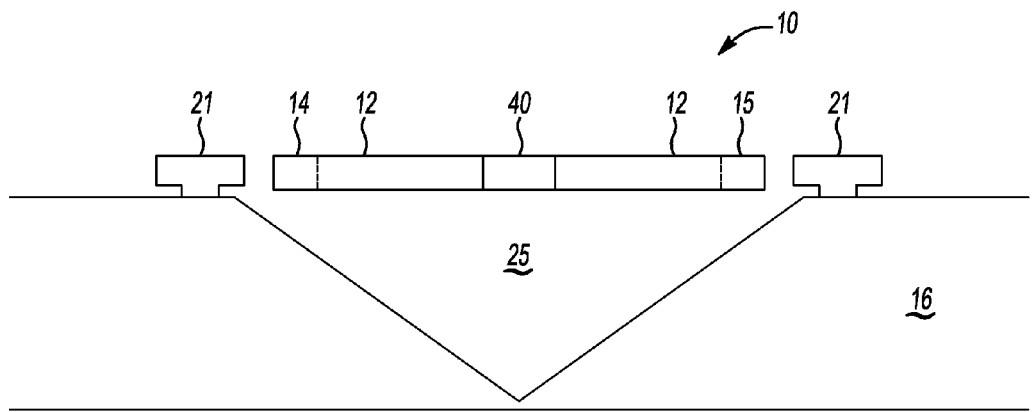
FIG. 3 depicts a cross-sectional view of the thermal detector of FIG. 2.
Figure 4:
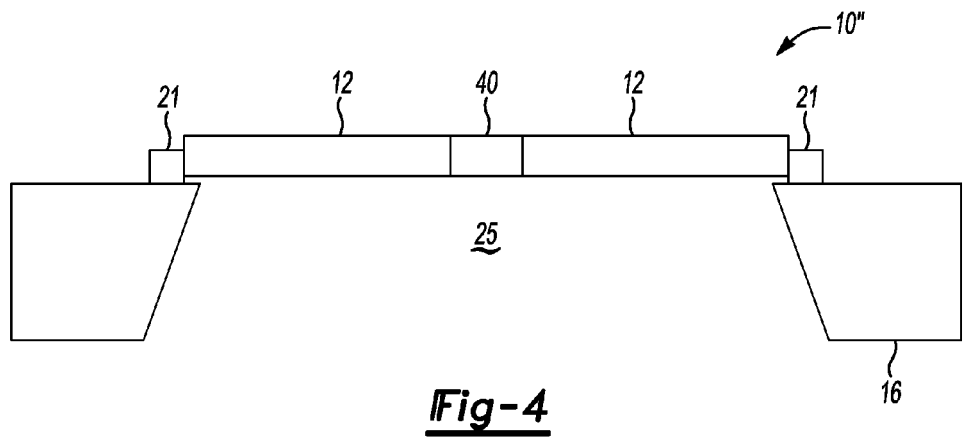
FIG. 4 depicts another cross-sectional view of a thermal detector including only an absorber.

FIG. 3 depicts a thermal detector 10" in accordance to another embodiment of the present invention. The detector 10" generally includes the absorber 12 and may be positioned as a single detector for a thermal sensing application. The detector 10" may be bulk micro-machined. In this configuration, arms are not present. The absorber 12 may comprise thermoelectric materials and be formed with superlattice quantum well materials. The electrical connection 21 is formed on each side of the absorber 12 for providing an electrical output from the detector 10". The absorber 12 is generally suspended over the cavity 25. The detectors (10, 10' and/or 10") as previously to referred to, will hereafter be designated as "10."

It is known to implement an IR detector that includes arms and an absorber being suspended over the substrate. In this conventional approach, the arms thermally isolate the absorber, which in turn causes a reduction in thermal conductance from the absorber to the substrate. By reducing thermal conductance between the absorber 12 and the arms 14, 15, heat transfer/leakage may be reduced and an improvement in IR detector performance may be realized. This conventional approach generally forms the thermoelectric structure (e.g., the arms and the absorber) with one or more of the following materials: bismuth-telluride, antimony-telluride, lead telluride, polysilicon, polysilicon-germanium, skutterudite, a nano-composite material, and a superlattice structure in order to achieve low thermal conductivity. By forming the detector with one or more of the aforementioned materials and by suspending the absorber and the arms, these conditions may cause the absorber and/or the arms to warp or buckle which may lead to a detector failure.

The embodiments described herein recognize, inter alia, that the absorber 12 and/or the arms 14, 15 as used in connection with an IR sensing device may be constructed with superlattice quantum well thermoelectric materials that may enable the detector 10 to realize adequate detector performance characteristics. Moreover, the embodiments disclosed herein contemplate encapsulating the superlattice quantum well materials of the absorber 12 and/or the arms 14, 15 with silicon nitride or silicon dioxide. The encapsulation of the absorber 12 and/or the arms 14, 15 with the silicon based materials may compensate or equalize stress that is induced during the deposition of the superlattice quantum well materials and increase the mechanical strength of the detector 10 while portions of the detector 10 are suspended over the ROIC 16. By increasing the mechanical strength of the detector 10 and by stress compensating the detector 10, warping or buckling of the detector 10 may be minimized or eliminated altogether. The embodiments further recognize that the absorber 12, the first arm 14, and the second arm 15 of the detector 10 may be constructed from superlattice (e.g., silicon/-silicon-germanium ($Si/Si_xGe_{1-x}$) where x may be an integer or a non-integer (hereafter "Si/SiGe")) quantum well thermoelectric materials. The first arm 14 and the first portion 36 may be formed of a P type superlattice quantum well thermoelectric material. The second arm 15 and the second portion 38 may be formed of an N type superlattice quantum well material.

By utilizing a superlattice quantum well thermopile 10 that includes the absorber 12 and/or arms 14, 15, such a condition minimizes thermal loss from the absorber 12 through the arms 14, 15 to substrate 16 and/or to any devices positioned proximate to the absorber 12, thereby thermally isolating the absorber 12 from a surrounding device. When IR from a scene heats the absorber 12, the detector 10 generates an output voltage that is proportional to the temperature difference between the absorber 12 and the substrate 16. Accordingly, if the absorber 12 was formed of material containing a high thermal conduction, detector performance may be adversely affected due to the leakage of thermal energy from the absorber 12. Because the superlattice quantum well material provides a low thermal conductivity, adequate thermal isolation at the absorber 12 may be achieved, thereby improving detector performance. In addition, superlattice quantum well materials also provide for a high Seebeck coefficient and high electrical conductivity which enables the detector 10 to provide an output voltage with a high signal-to-noise ratio which provides for a high fidelity representation of the amount of IR radiation sensed by absorber 12. Generally, the detector 10 may not provide for current flow. However, in some embodiments the detector 10 is capable of providing a flow of current in the milliamp range.

While conventional IR detectors are known to include bismuth-telluride, antimony-telluride, lead telluride, polysilicon, polysilicon-germanium, skutterudite, a nano-composite material, and a superlattice structure as a means to achieve low thermal conductivity (i.e., minimize heat dissipation or transfer from the detector) for a suspended absorber and/or suspended arms, such materials may not provide sufficient mechanical support or not be properly stress compensated. It can be seen (as shown below) that the use of superlattice quantum well thermoelectric materials in the detector 10 may provide for adequate thermal conductivity and may serve as an alternate to the types of materials in conventional detectors.

In general, in order to obtain a large response from a thermopile detector 10, the thermal conductance from the detector 10 (e.g., absorber 12 and/or the arms 14, 15) to the thermal ground plane (e.g., within the substrate 16), $G_K$, should be small. Therefore, the thermal conductivity of the thermopile material should be as small as possible. Conclusively, it may be desirable for the material within the detector 10 to have (a) a high Seebeck coefficient and (b) a high electrical conductivity. A figure of merit for a thermopile made of n-type and p-type materials is defined as follows:

$$Z = \frac{(\alpha_p - \alpha_n)^2}{[(r_p k_p)^{1/2} + (r_n k_n)^{1/2}]^2} \quad (1)$$

Where:

$\alpha_p$ = Seeback constant for $p$-type material in $\frac{\text{Volts}}{K}$ $\alpha_n$ = Seeback constant for $n$-type material in $\frac{\text{Volts}}{K}$ $k_p$ = Thermal conductivity for $p$-type material in $\frac{\text{Watt}}{m \cdot K}$ $k_n$ = Thermal conductivity for $n$-type material $\frac{\text{Watt}}{m \cdot K}$ $\rho_p$ = Resistivity of $p$-type material in $\Omega \cdot m$ $\rho_n$ = Resistivity of $n$-type material in $\Omega \cdot m$ This figure of merit may not be representative of Signal to Noise Ratio related to thermal imaging because it may not be proportional to the common figure of merit for IR detectors, detectivity or D*. A more appropriate figure of merit may be one that is proportional to D*:

$$Z_{D^*} = \frac{(\alpha_p - \alpha_n)}{[(\rho_p + \rho_p)^{1/2}(k_p + k_n)]} \quad (2)$$

This new figure of merit assumes that the arms 14, 15 have the same length and cross-sectional area. Table 1 (below)

shows this new figure of merit for a selected group of materials. Performance improvement based on thermopile material choice may be evident.

TABLE 1

FPA Thermocouple Materials
Thermopile Material Type

|  | polysilicon | $Si_{0.7}Ge_{0.3}$ polysilicon | $Bi_2Te_3/Sb_2Te_3$ | QW Si/SiGe |
|---|---|---|---|---|
| post-CMOS Compatible | NO | YES | YES | YES |
| $Z_D*$ FoM $(W/cm)^{-1/2}$ | $1.9 \times 10^{-2}$ | $8.1 \times 10^{-2}$ | $2.8 \times 10^{-1}$ | 1.6 |

For small pitch (e.g., ≤50 μm) arrays, $Bi_2Te_3$ and np $Si_{0.7}Ge_{0.3}$ may be practical choices for the thermoelectric materials. The reason for rejecting standard np polysilicon is that its thermal conductivity may be too large to achieve reasonable detector sensitivities. Moreover, the deposition temperature may be too high for post Complementary Metal-Oxide-Semiconductor (CMOS) compatibility. The measurements of interest (e.g., resistivity, Seebeck coefficient, and thermal conductivity) for quantum well Si/SiGe, $Bi_2Te_3$, $Si_{0.7}Ge_{0.3}$ and standard np polysilicon are given below in the Table 2:

TABLE 2

$Bi_2Te_3/Sb_2Te_3$ Parameters, Polysilicon Parameters, QW Parameters

| Thermopile Material Type | Resistivity $\mu\Omega \cdot m$ | Seebeck $\frac{\mu V}{K}$ | $k\frac{W}{m \cdot K}$ |
|---|---|---|---|
| QW Si/SiGe (NP) | 0.1 to 10.0 | \|1200\| | 3-5 |
| $Bi_2Te_3$ (N) | 12.6 | −248 | 1.3 |
| $Sb_2Te_3$ (P) | 12.6 | 188 | 1.8 |
| $Bi_2Te_3$-$Bi_2Se_3$ (N) | 15 | −200 | 1.2 |
| $Bi_2Te_3$-$Sb_2Te_3$ (P) | 12 | 240 | 1.2 |
| $Si_{0.7}Ge_{0.3}$ polysilicon (NP) | 10 to 1000 | \|100\| to \|500\| | 5 |
| polysilicon (NP) | 10 to 1000 | \|100\| to \|500\| | 23 |

Although $Bi_2Te_3$ and $Sb_2Te_3$ can produce high performing thermopile detectors, choosing $Bi_2Te_3$ and $Sb_2Te_3$ may have several drawbacks. For example, (1) detector resistance can fall around 3 kΩ and a consequence is that electronic noise may dominate; (2) deposition and etching of $Bi_2Te_3$ and $Sb_2Te_3$ is being heavily researched and may not be mature yet (however, $Bi_2Te_3$ and $Sb_2Te_3$ can be deposited at low temperatures, patterned and dry etched); (3) the Temperature Coefficient of Responsivity (TC$\Re$) (≈0.1%) may be higher than np $Si_{0.7}Ge_{0.3}$ (<0.04%) (e.g., a lower TC$\Re$ may require less effort in temperature compensation of the responsivity); and (4) the thermoelectric properties of $Bi_2Te_3$ and $Sb_2Te_3$ may vary greatly if the stoichiometry is not maintained which implies tight controls on the deposition and non-conventional deposition processes such as co-evaporation. In contrast, Si/SiGe superlattice quantum wells comprise widely used materials in CMOS and Micromechanical Systems (MEMS) processing. Moreover, stoichiometry may not be an issue in the Si/SiGe superlattice quantum well implementation, which may allow deposition to be conducted with less critical, controls.

The thermal conductivity of $Bi_2Te_3$ thin films has been measured to be $$1.2 \frac{W}{mK}$$

which may be close the thermal conductivity of PECVD silicon nitride, where thermal conductivity may be $$\leq 1.18 \frac{W}{mK}.$$

The thermal conductivity of bulk $Bi_2Te_3$ may be $$1.7 \frac{W}{mK}$$

and the lower thermal conductivity may be a common effect in very thin films. The thermal conductivity of $Bi_2Te_3$ may fall further as the film thickness falls below 0.5 μm.

As shown above in Table 2, $Bi_2Te_3$ and silicon nitride may have similar thermal conductivities. Due to this fact, adding significant amounts of silicon nitride to the arms and/or to the absorber when formed of $Bi_2Te_3$ may cause a decrease in detector performance. Due to this condition, conventional implementations tend to avoid adding silicon nitride or silicon dioxide to bismuth telluride based detectors. In contrast, the arms 14, 15 and/or the absorber 12 of the present disclosure may include various amounts of silicon nitride and/or silicon dioxide with quantum well Si/SiGe. This condition may not cause a significant loss in detector performance because the thermal conductivity of quantum well Si/SiGe may be ≈3-4 times greater than that of silicon nitride. As such, the addition of the thermal conductivity added by the silicon nitride may be negligible in terms of the overall increase in thermal conductivity added to the Si/SiGe quantum well with the silicon nitride. For example, the thermal conductivity of Si/SiGe quantum well may be between 3-5 W/mK. The thermal conductivity of the silicon nitride may be 1.2 W/mK. Adding moderate amounts of the silicon nitride may not affect detector performance because the thermal conductivity of the Si/SiGe quantum well may dominate. In general, the thickness of the silicon nitride may be anywhere from 10% to 100% of the overall thickness of the quantum well arms 14, 15. For example, if the arms 14, 15 are 1000 Å thick, then the thickness of the silicon nitride may be in the range of 100 Å to 1000 Å. In general, the largest component of the total thermal conductance is due to the arms 14, 15.

Conventional based detectors that may implement a suspended arm and absorber structure tend to avoid encapsulating the arms and/or the absorber with silicon nitride when bismuth telluride materials are used to form the films in the detector to prevent an increase in thermal conductivity. However, it has been discovered as set forth herein, that by removing the encapsulated silicon nitride, such a condition may aid to the warping and/or buckling of the detector 10 as noted above. For example, the removal of the encapsulated silicon nitride may decrease detector mechanical strength and remove the capability to stress compensate. Unless the detector is stress compensated, the detector may warp and become non-functional.

Another useful dielectric in MEMS processing may be silicon dioxide. When deposited, silicon dioxide may normally be in compressive stress, this material in conjunction with silicon nitride can be used to compensate for stress and additionally may be an effective etch stop. The thermal conductivity of thin film silicon dioxide may be $$\leq 2.0 \frac{W}{mK}.$$

Figure 5:
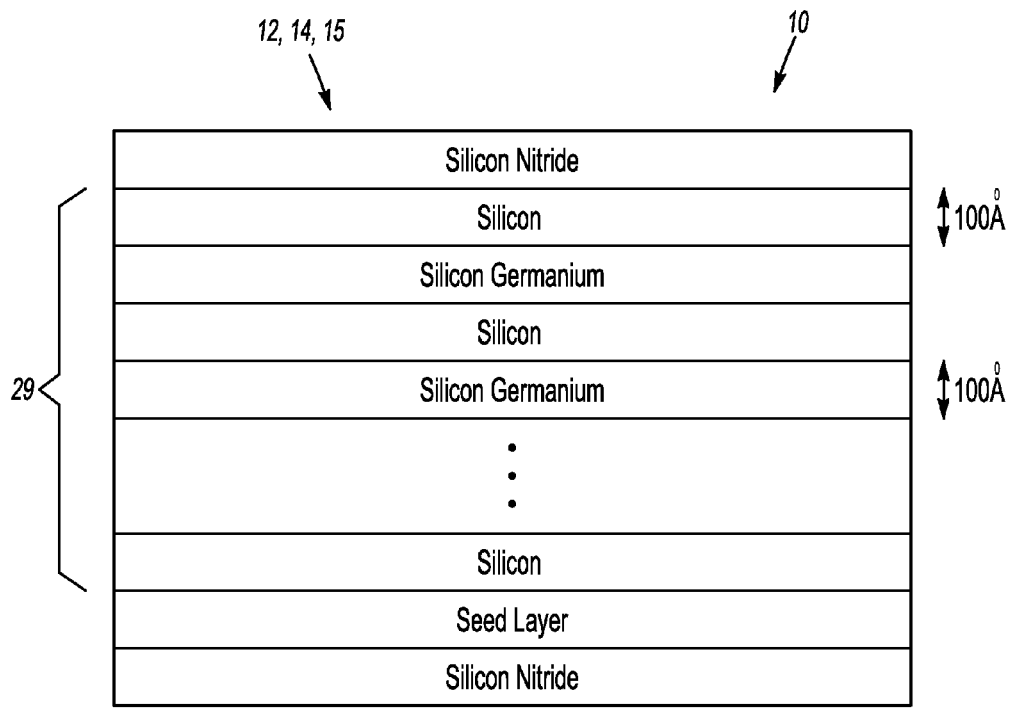
FIG. 5 depicts a superlattice quantum well thermoelectric material that is encapsulated by silicon based materials in accordance to one embodiment of the present invention.

FIG. 5 depicts a superlattice quantum well thermoelectric material that is encapsulated by silicon materials. In general, the superlattice quantum well layers of the absorber 12, and/or the arms 14, 15 and may be sandwiched between a top layer of silicon nitride and a bottom layer of silicon nitride (or sandwiched between a top layer of silicon dioxide and a bottom layer of silicon dioxide or sandwiched between a top layer of silicon nitride and a bottom layer of silicon dioxide (or vice versa) (see, element 29 in FIG. 2 alternating layers of Si/SiGe (e.g., barrier or conducting layers where the barrier layers comprise Si and the conducting layers comprise SiGe)). In reference to FIGS. 1-2, the first arm 14 and the first portion 36 may be formed a p-type superlattice quantum well that is encapsulated by silicon nitride. Conversely, the second arm 15 and the second portion 38 may formed of an n-type superlattice quantum well that is encapsulated by silicon nitride. The SiGe layer positioned above the silicon nitride layer may include a high Ge content polysilicon SiGe seed layer. The Ge content may be at least 70%. When deposited at low temperatures, the high Ge of SiGe seed layer may form polysilicon-germanium which may have a somewhat ordered crystalline structure on which to lay down the next layer of silicon.

Figure 6A:
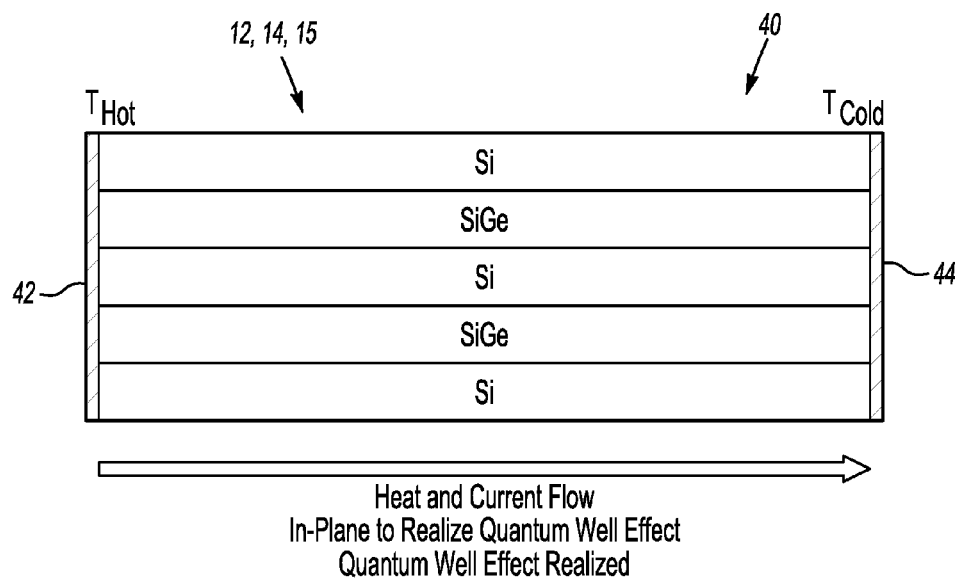
FIGS. 6A-6B depict one embodiment that realizes a quantum well and another embodiment that does not realize a quantum well effect; respectively.
Figure 6B:
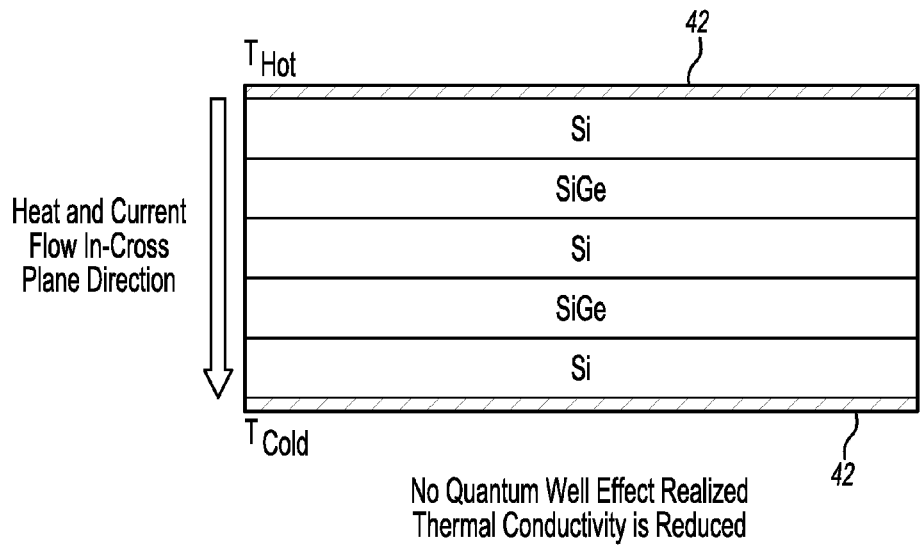

FIGS. 6A-6B depict one embodiment that realizes a quantum well effect and another embodiment that does not realize a quantum well effect, respectively. In reference to FIG. 3a, a portion of the detector (e.g., first arm 14, second arm 15, and/or absorber 16) may include any number of films 41. The films 41 may comprise alternating layers of Si and Si/Ge (e.g., superlattice of Si and Si/Ge). Each layer of Si and Si/Ge may have a thickness of ≤200 Å. The total thickness of the quantum well material within the detector 10 may be ≤2000 Å. A first contact 42 is positioned on one end and a second contact 44 is positioned on another end. The first contact 42 may be horizontally positioned away from the second contact 44. By positioning the first contact 42 horizontally away from the second contact 44, small amounts of current and heat may flow laterally, from the first contact 42 through the layers of Si/SiGe to the second contact 44 (e.g., in plane). Such a condition enables the first arm 14, the second arm, and/or the absorber 16 to realize the quantum well effect.

One approach to increasing the performance of thermoelectric materials may be to form compositionally modulated materials, mainly by quantum well confinement of carriers in the active layers in a multilayer film by adjacent barrier layers. The approach as disclosed herein is to enclose each electrically active layer by a material which has a band offset sufficient to form a barrier for the charge carriers. An improvement in the thermoelectric properties (e.g., Seebeck effect, electrical resistivity and thermal conductivity) is expected to follow from an increase in the density of states (e.g., increased Seebeck), an increase in carrier mobility (e.g., lower electrical resistance), and inhibited phonon flow due to strain between the quantum well and barrier layers (e.g., lower thermal conductivity). The layer thicknesses may be ≤200 Å.

FIG. 6B depicts that the first contact 42 is vertically displaced from the second contact 44. Small amounts of current and heat may flow in a cross-plane direction which is perpendicular to the in-plane direction of the quantum well configuration noted above from the first contact 42 through the layers of Si/SiGe to the second contact 44. While thermal conductivity may be reduced, this implementation fails to realize the quantum well effect.

Figure 7:
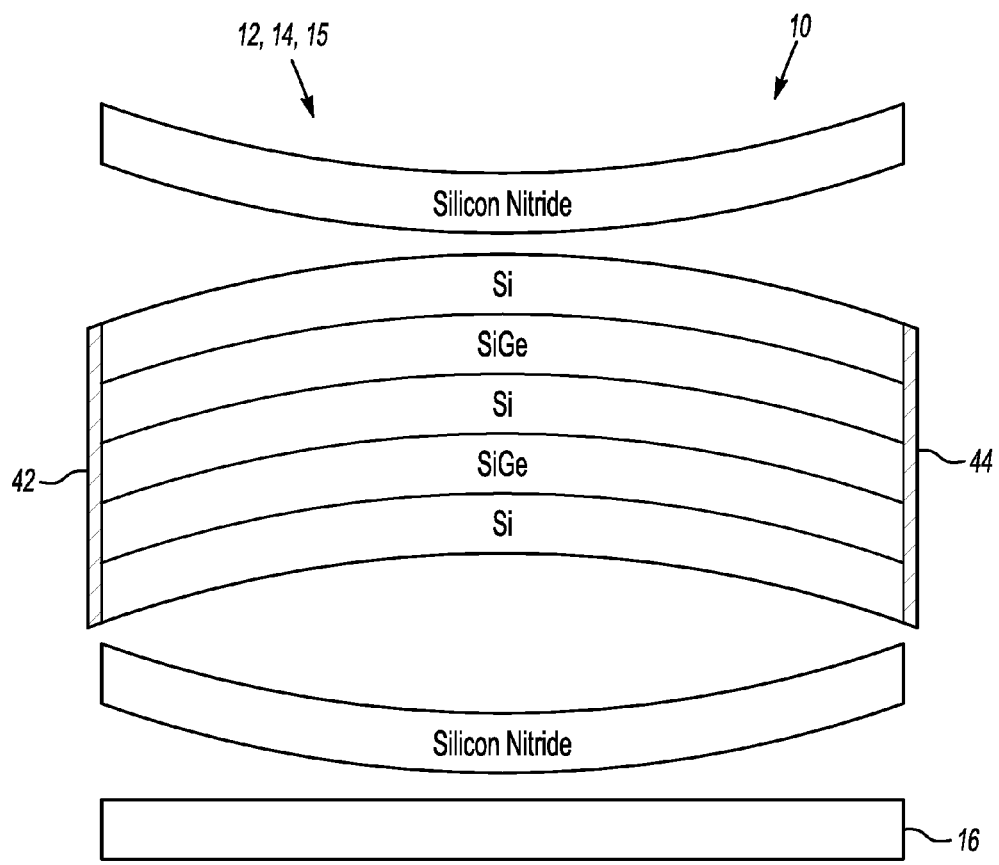
FIG. 7 depicts various stresses caused by layers of silicon nitride and the superlattice quantum well materials during deposition.

FIG. 7 depicts the various stresses caused by the layers of silicon nitride and the superlattice quantum well materials during deposition in one or more of the absorber 12 and/or in the arms 14, 15. For example, materials such as quantum well Si/SiGe when deposited, could be in a state of compressive stress. Under compressive stress, the various layers of Si and SiGe may expand with respect to the substrate 16. In this state of stress, the layers of Si and Si/Ge (either in the absorber 12 and/or in the arms 14, 15) when suspended and attached at two points (e.g., at the posts 22, 30), may buckle over the substrate 16.

The silicon nitride on the other hand, when deposited, could be in a state of tensile strength. Under tensile stress, each layer of silicon nitride may shrink with respect to the substrate 16. In this state of stress, each layer of silicon nitride when suspended and attached at two points (e.g., at the posts 22, 30), may be stretched by the substrate 16. By using predetermined thickness and deposition parameters for the silicon nitride and the quantum well Si/SiGe, a nearly stress free detector may be constructed. In general, due to the fact that the two stresses (e.g., compressive and tensile) are of opposite type, a nearly stress free thin film could be formed by combining the Si and Si/Ge layers to the silicon nitride layers. The thickness for each layer may depend on the magnitude of the stress in each layer.

In general, if the layers (e.g., layers of Si and Si/Ge and silicon nitride) of the detector 10 have equal and opposite stress levels, then the deposition of the layers on top of one another may produce a nearly stress free film. For example, let $\sigma_{m_1}$ represent the stress of material, $m_1$ (e.g., the layers of Si and Si/Ge) and $\sigma_{m_2}$ represent the stress of material, $m_2$ (e.g., the layers of silicon nitride). A material that is in tensile stress may have a positive value and a material in compressive stress may have a negative value. Let $t_1$ represent the thickness for a first set of layers (e.g., Si and Si/Ge) and $t_2$ represent the thickness for a second set of layers (e.g., silicon nitride). In order to produce a stress compensated detector 10, the following equation may need to be satisfied:

$$\sigma_{m_1}t_1+\sigma_{m_2}t_2=0 \qquad (3)$$

This expression may be easily generalized to more than two sets of layers.

As noted above, the quantum well Si/SiGe may be in a state of compressive stress when deposited and the silicon nitride may be in a state of tensile stress when deposited, the compressive stress caused by the deposition of the quantum well Si/SiGe may be offset by the tensile stress caused by the deposition of the silicon nitride which may result in a nearly stress free suspended detector implementation.

In general, each layer of SiGe may be n or p-type doped in the absorber 12 and/or in the arms 14, 15. The Si layers may not be doped and are therefore not electrically conductive. The doping concentration of one or more layers of the silicon germanium in the absorber 12 and/or in the arms 14, 15 is roughly between 5×10^18 to 5×10^19 atoms/cm^3. The doping concentration may not be the same for the n-type and p-type. The electrical resistance of the n-type arm and p-type arm should be the same to maximize the Seebeck effect this is why the doping concentration of the various layers of silicon germanium is different as it may be adjusted to achieve equivalent arm resistance. Moreover, as the doping concentration moves up, the electrical resistance goes down, but the Seebeck effect also goes down. The optimal doping concentration for the layer of silicon germanium is achieved to ensure that the electrical resistance is the same between the n-type and p-type arm and, moreover, to achieve maximum signal to noise ratio.

The use of the superlattice quantum well based thermoelectric materials in the detector 10 provide for, but not limited to, adequate thermal conductivity, increased Seebeck effect, and low resistivity which may increase detector performance. Encapsulating the superlattice quantum well based materials with silicon based materials (such as silicon nitride and/or silicon oxide or other suitable materials) may increase mechanical strength of the detector 10 and stress compensate offsetting stress caused by the various layers of the superlattice quantum well materials. In short, the present disclosure contemplates that the use of superlattice quantum well thermoelectric materials when combined with silicon based materials in the detector 10 may provide (i) increased detector performance due to the acceptable levels of thermal conductivity, increased Seebeck effect and low resistivity that have been discovered to be found in connection with the superlattice quantum well thermoelectric materials and (ii) increased mechanical strength/stress compensation caused by offsetting stress between the superlattice quantum well thermoelectric materials and the encapsulated silicon based materials.

Figure 8:
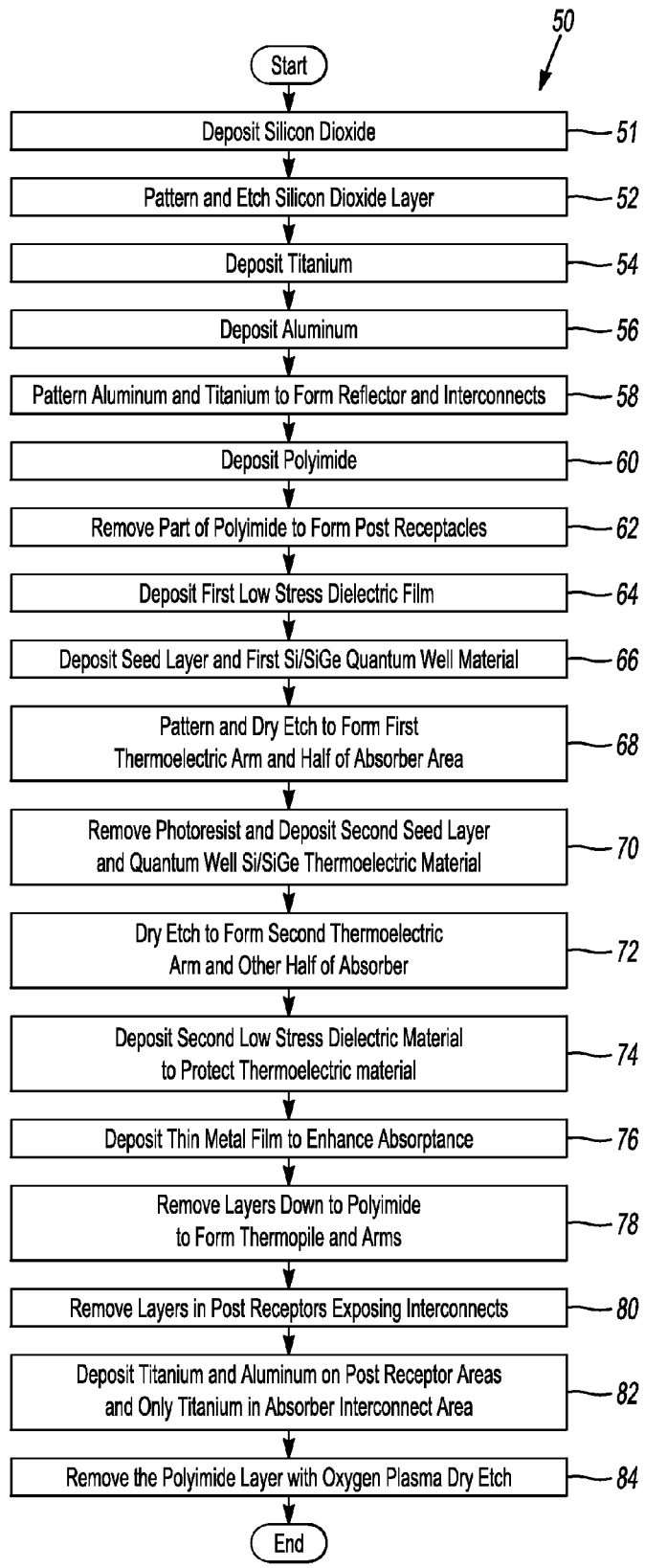
FIG. 8 depicts a fabrication process flow for producing the quantum well thermoelectric detector.

FIG. 8 depicts a fabrication process flow 50 for producing the quantum well thermoelectric detector 10 in accordance to one embodiment of the present invention. It is contemplated that the process flow 50 may be utilized to produce the detector 10. The process flow 50 depicts the fabrication of the detector 10 without the use of silicon nitride as an etch stop.

In operation 51, form a silicon dioxide layer.

In operation 52, pattern and dry etch the silicon dioxide.

In operation 54, a layer of titanium is deposited over the layer of silicon dioxide. Titanium, TiW, Cr, or other similar metals may be used as a buffer layer as aluminum may stick to these refractory metals and the refractory metals may stick to whatever they are deposited on.

In operation 56, a layer of aluminum is deposited over the layer of titanium (see FIG. 6A). Aluminum may provide for better electrical conductivity than refractory metals.

In operation 58, the aluminum and titanium (or TiW or Cr) are patterned to form the reflector 17 and interconnects (such as the input pads 24 and 32 on the ROIC 16) (see FIG. 6B).

In operation 60, a layer of polyimide is deposited over the aluminum. Polyimide is an organic material that may be used as a sacrificial layer. That is in the end the polyimide may be etched away in an oxygen plasma etch. The polyimide may be able to withstand the high temperature processing and may be easily etched away. The polyimide may be necessary due to its ability to be easily etched away since it may be at a bottom of the MEMS stack.

In operation 62, a portion of the polyimide is removed to define an opening to form the posts 22, 30 later in the process 50.

Figure 9A:
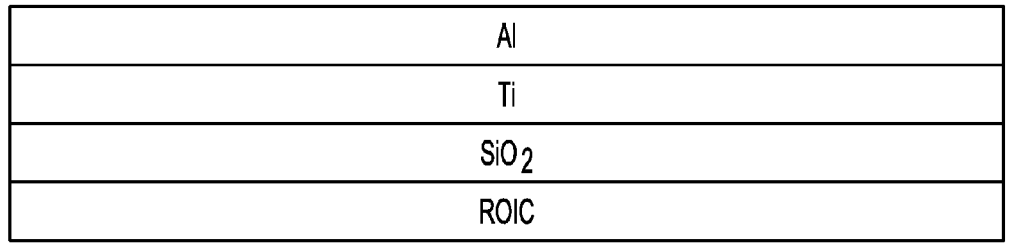
FIGS. 9A-9D depict various formations of the detector when fabricated in connection with the process flow of FIG. 8.
Figure 9B:
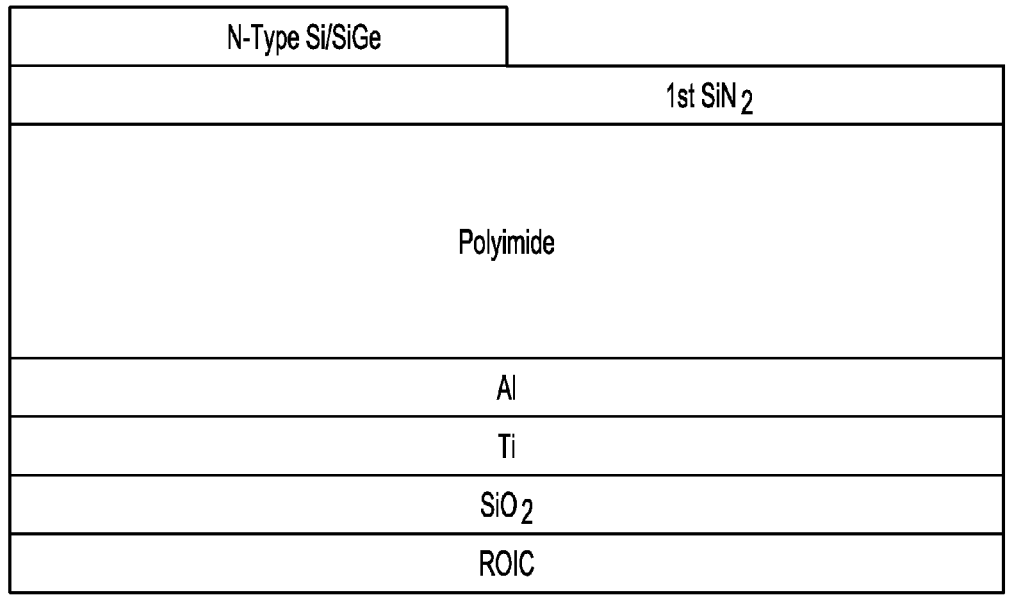
Figure 9C:
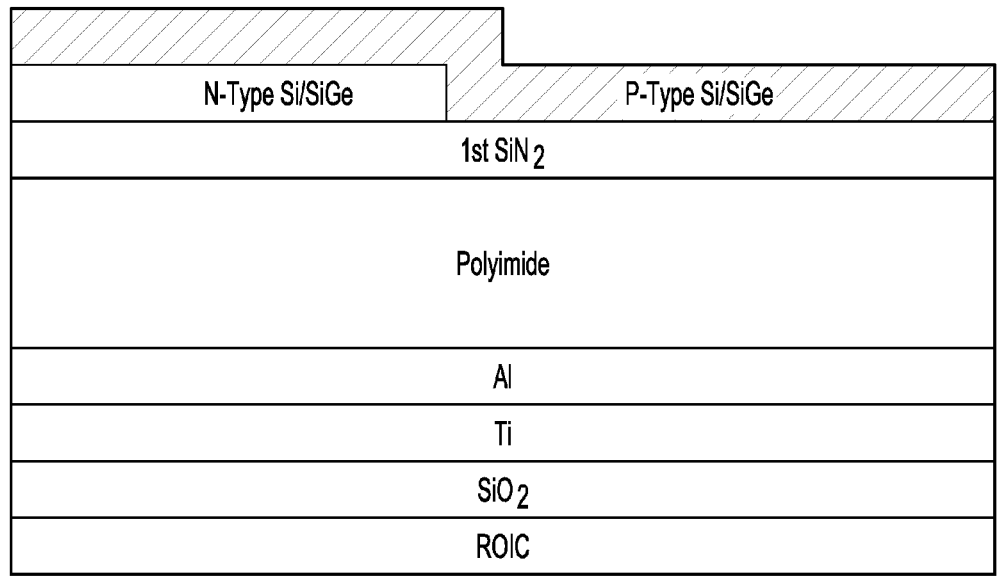

In operation 64, a first layer of silicon nitride is deposited on top of the polyimide (see FIG. 9C). As noted above, when the silicon nitride is deposited, the layer of silicon nitride may exhibit a form of tensile stress.

In operation 66, a seed layer is deposited over the ROIC 19. This deposition may include a post-CMOS compatible SiGe polysilicon or a post-CMOS compatible Ge. The seed layer may enable the detector 10 to achieve sufficient quantum well performance. The seed layer may exhibit a crystalline structure or short range ordering of its structure. For example, the Si/SiGe layers should at least have some sort of short range crystalline order. The reason for this is that the electrical conductivity may be poor because non-crystalline materials are known to be poor electrical conductors. It may be difficult obtaining true polysilicon deposition at low temperatures (e.g., ≤450° C.) for Si and high Si content ($Si_xGe_{1-x}$)(x≥0.4). On the other hand, high Ge content SiGe can be deposited at lower temperatures (e.g., ≤450° C.) and be polycrystalline. For example, when the Ge content of $Si_xGe_{1-x}$ is 70% (x=0.3), good quality polysilicon $Si_{0.3}Ge_{0.7}$ can be deposited at temperatures ≤400° C. This may make a very good seed layer such that when Si or SiGe (typically $Si_{0.8}Ge_{0.2}$) is deposited via sputtering at ≈350° C. the material "follows" the crystalline ordering of the lower layer thus obtaining a more crystalline orientation of the sputtered material. This part may be of significance in producing high performance detectors. The addition of the seed layer may enable latter deposited alternating layers of Si and SiGe to achieve favorable quantum well thermoelectric properties. The layer of silicon dioxide is formed on top of the seed layer to form the substrate 16.

Alternating layers of Si and SiGe quantum well layers are also deposited to top of the layer of silicon nitride. Each layer of Si and SiGe may be approximately 100 Å. These layers of Si and SiGe may exhibit a state of compressive stress. The alternating layers of Si and SiGe may be n-type doped (see FIG. 9C). It is recognized that the layer of Si and SiGe may be p-type doped as well. In general, four to five periods of Si and SiGe may be used in the detector 10 (or 8 to 10 layers of Si and SiGe). The thickness of the silicon nitride may be up to 1000 Å (if 10 layers are used). The total thickness of the silicon nitride and the alternating layers of Si and SiGe (assuming 10 layers of Si and SiGe (e.g., 1000 Å) and an upper limit thickness of silicon nitride (e.g., 1000 Å)) has a total thickness of 2000 Å.

In operation 68, a first portion 36 or 38 of the absorber 12 and the arm 14 or 15 may be formed by way of being patterned and dry etched. This portion of the absorber 12 and the arm 14 or 15 may be n-type.

In operation 70, photoresist is removed and a second set of alternating layers of Si and p-type Si/Ge are deposited directly over the layers of Si and n-type SiGe and silicon nitride layer. In general, the photoresist define which areas may be etched and which areas may not be etched.

In operation 72, a second portion 36 or 38 of the absorber 12 and the arm 14 or 15 (e.g., opposite to that formed in operation 68) may be formed by way of being patterned and dry etched.

In operation 74, a second layer of silicon nitride is deposited on top of both the alternating p-type quantum well Si/SiGe layers and the alternating n-type quantum well Si/SiGe layers. As noted above, when the silicon nitride is deposited, the layer of silicon nitride may exhibit a form of tensile stress. Both layers of the silicon nitride provide tensile strength which may compensate for the compressive stress added to the detector 10 with the alternating quantum well Si/SiGe layers.

In operation 76, a thin metal film is deposited over the second layer of silicon nitride to enhance radiation absorption.

In operation 78, a portion of the second layer of silicon nitride and the alternating layers of Si and SiGe (e.g., n-type or p-type) are removed down to the polyimide.

In operation 80, the portions of the thin metal film, the first and second layers of silicon nitride, the alternating layers of Si and Si/Ge are removed to define an opening for forming the posts 22, 30, respectively.

Figure 9D:
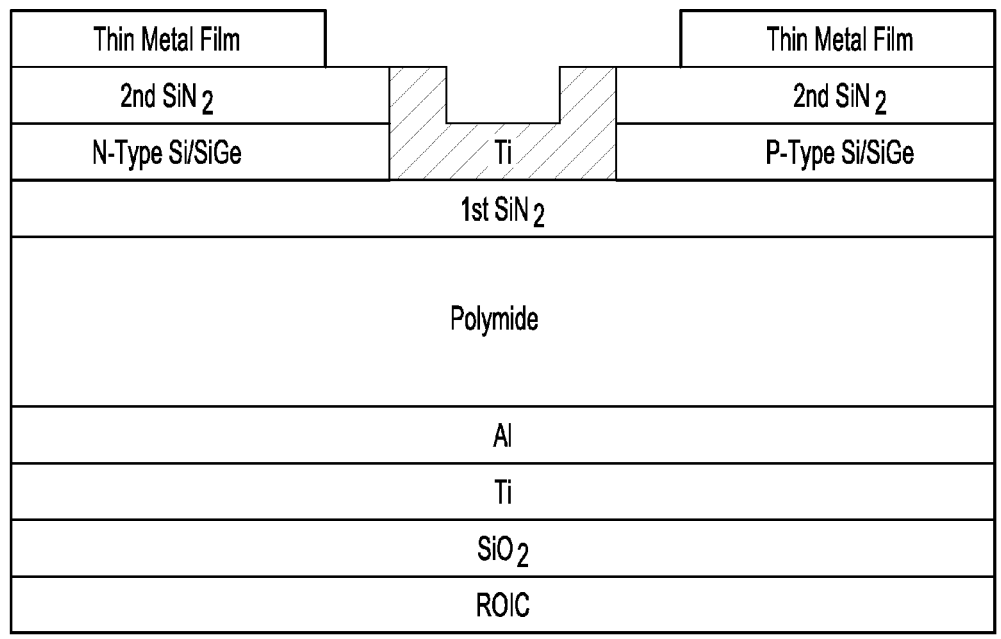

In operation 82, titanium and aluminum are deposited in the openings formed within the arms 14, 15. The titanium and the aluminum are deposited within the openings to form the posts 22, 30. Only titanium is deposited over the absorber region (see FIG. 9D). This section of the detector 10 is also known as the active region 40 on the absorber 12.

In operation 84, the entire polyimide layer is removed with an oxygen plasma dry etch. By removing the entire polyimide layer, the first and second layers of the silicon nitride and the alternating layers of Si and SiGe are suspended over the substrate 16. The suspended layers of silicon nitride and Si and SiGe are coupled to the ROIC 19 via the posts 22, 30.

FIGS. 9A-9D depict various formations of the detector 10 when being fabricated as noted in connection with FIG. 8.

Figure 10:
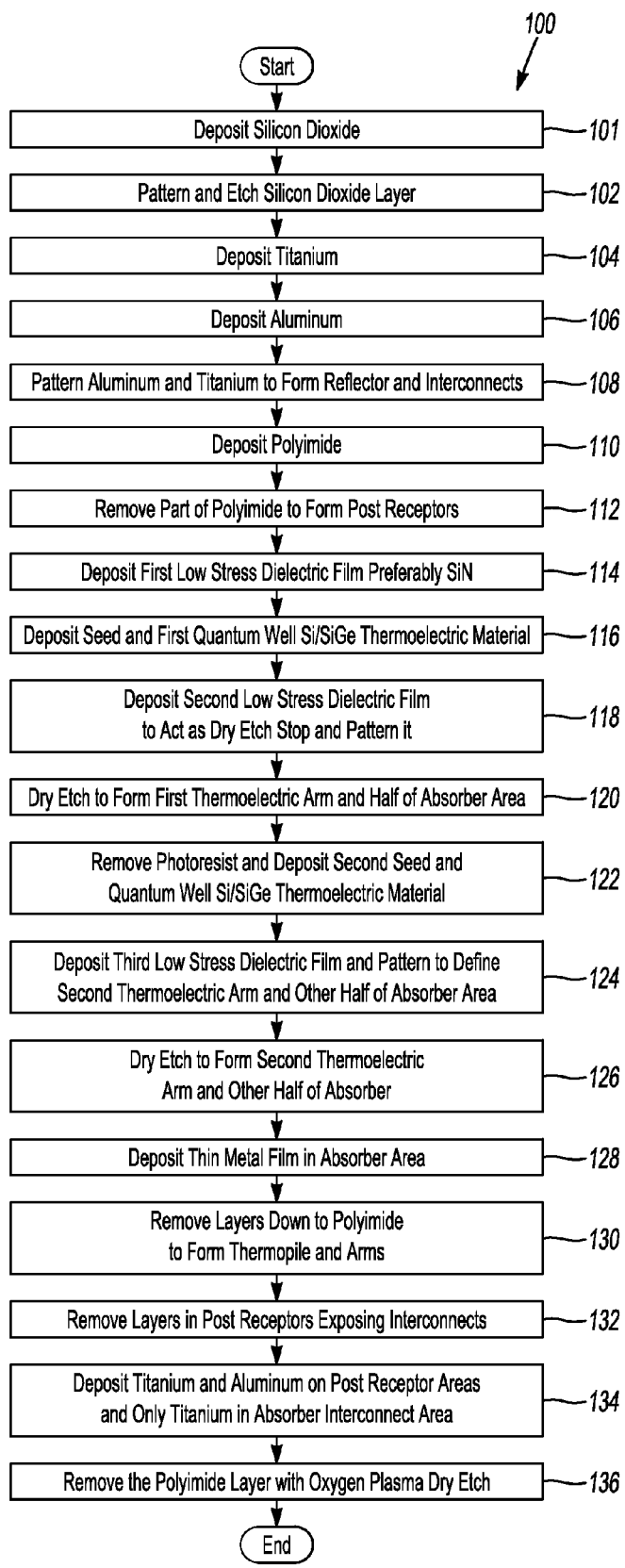
FIG. 10 depicts a fabrication process flow for producing the superlattice quantum well thermoelectric detector.

FIG. 10 depicts a fabrication process flow 100 for producing the quantum well thermoelectric detector 10 in accordance to one embodiment of the present invention. The process flow 100 depicts the fabrication of the detector 10 with the use of silicon nitride as an etch stop.

Operations 101, 102, 104, 106, 108, 110, 112, 114, and 116 are similar to operations 51, 52, 54, 56, 58, 60, 62, 64, 66, respectively, as noted in connection with FIG. 8.

In operation 118, a second layer of silicon nitride is deposited on top of the alternating layer n-type quantum well Si/SiGe. It is recognized that either p-type or n-type quantum well Si/SiGe may be deposited. As noted above, when the silicon nitride is deposited, the layer of silicon nitride may exhibit a form of tensile stress. Both layers of the silicon nitride provide tensile strength, which may compensate for the compressive stress added to the detector 10 with the alternating layers of the n-type quantum well Si/SiGe. The second layer of silicon nitride acts as a dry etch stop to protect the layers of material that are below the silicon nitride when additional layers of material are added later in the fabrication process.

Figure 11A:
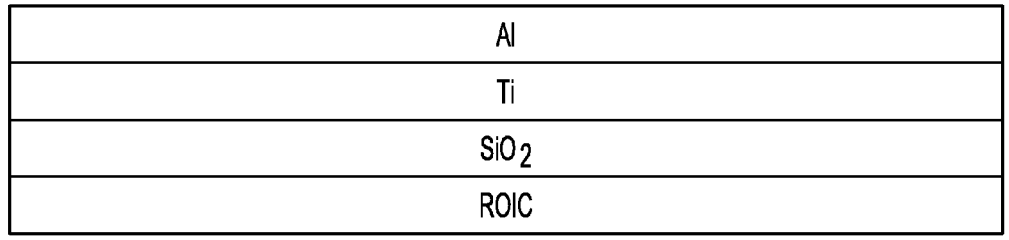
FIGS. 11A-11G depict various formations of the detector when being fabricated in connection with the process flow of FIG. 10.
Figure 11B:
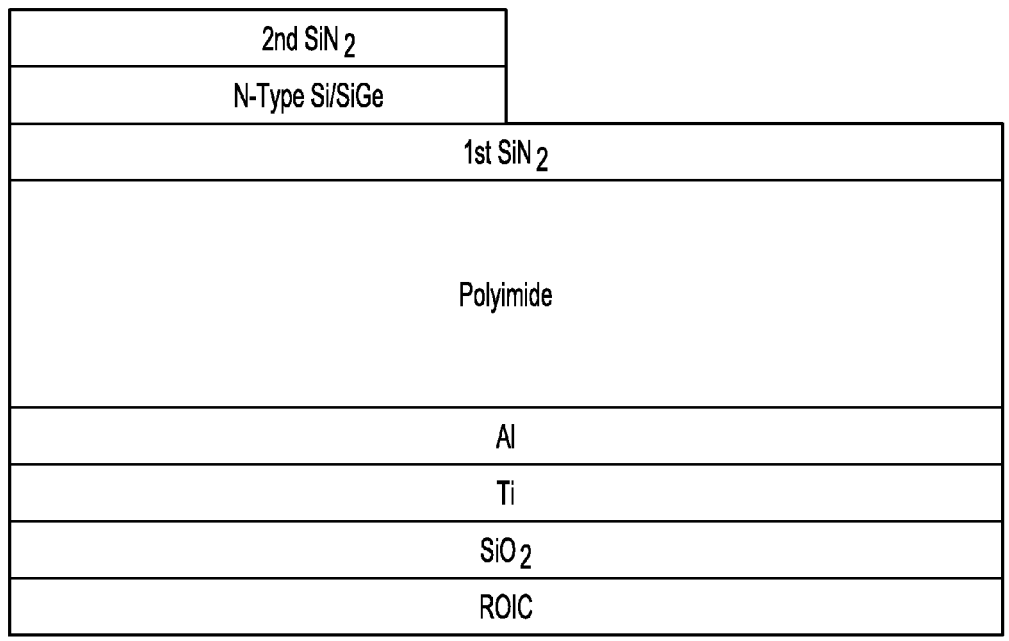

In operation 120, the second layer of silicon nitride and the alternating layers of the n-type quantum well Si/SiGe layers are dry etched to form the arm 15 and the second portion 38 of the absorber 12 (see FIG. 11B). For example, the second portion 38 of the absorber 12 and the arm 15 may be formed by dry etching. This portion of the absorber 12 and the arm 15 may be n type. In this operation, the layers of Si/SiGe may be encapsulated by the first and second layers of the silicon nitride. This condition may stress compensate the arm 15 and the second portion 38 within the detector 10.

In operation 122, photoresist is removed and a second set of alternating layers of p-type quantum well Si/SiGe materials are deposited. The second set of alternating layers of p-type Si/SiGe materials are deposited directly over the first and second layers of silicon nitride (see FIG. 11C).

Figure 11C:
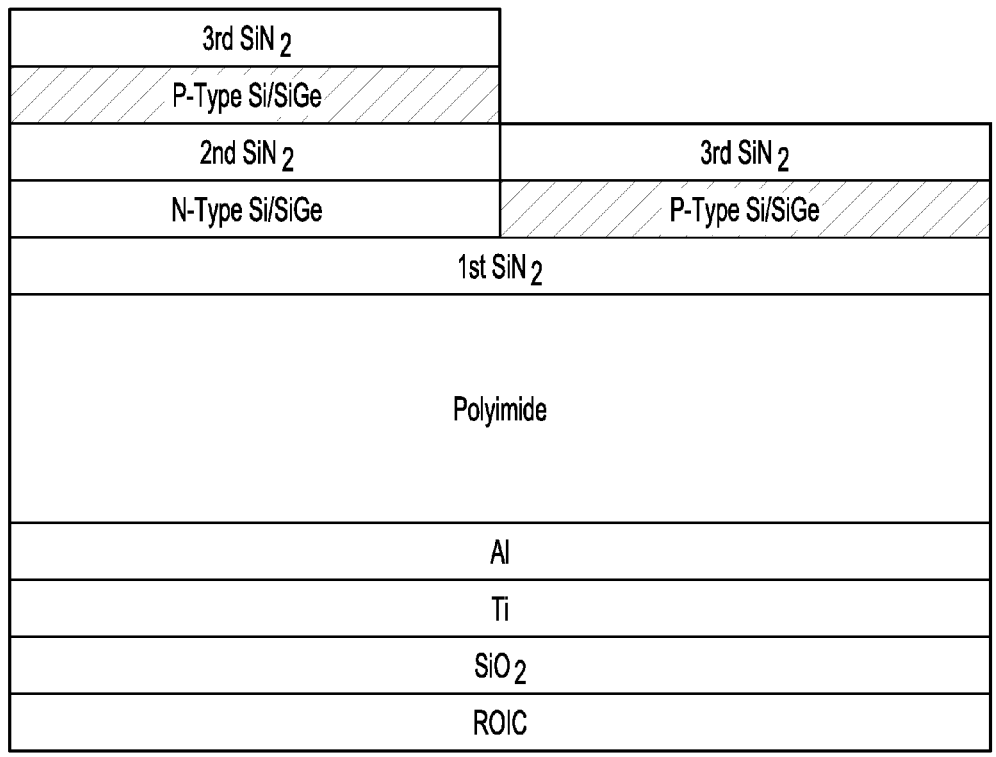
Figure 11D:
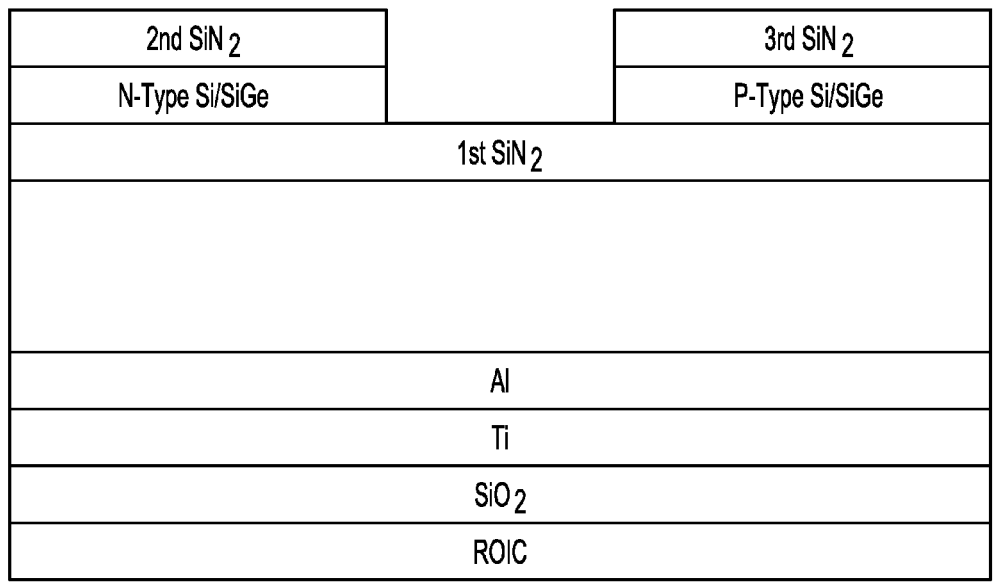

In operation 124, a third layer of silicon nitride is deposited on top of the second set of alternating layers of p-type Si/SiGe materials (see FIG. 11C).

In operation 126, the third layer of silicon nitride and the second set of alternating layers of Si and p-type Si/SiGe are dry etched to form the first arm 14 and the first portion 36 of the absorber 12. In this operation, the first of second alternating layers of Si and p-type Si/SiGe materials may be encapsulated by the first and third layers of the silicon nitride (see FIG. 9D). This condition may stress compensate the arms 14, 15 and the first and second portion 36, 38 within the detector 10.

Figure 11E:
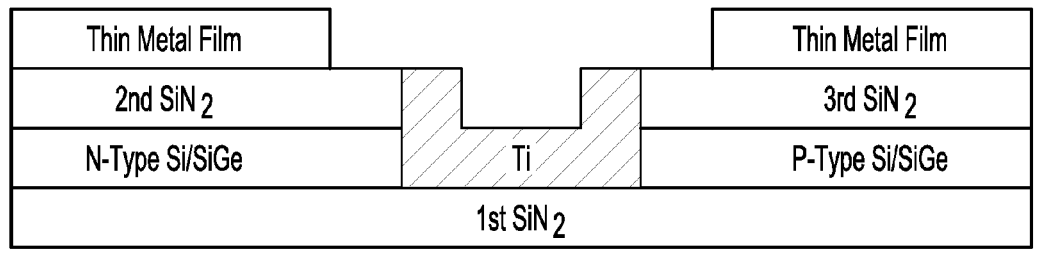
Figure 11E:
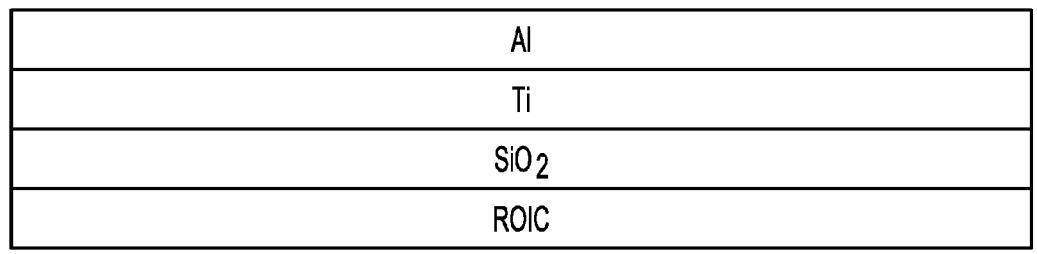
Figure 11F:
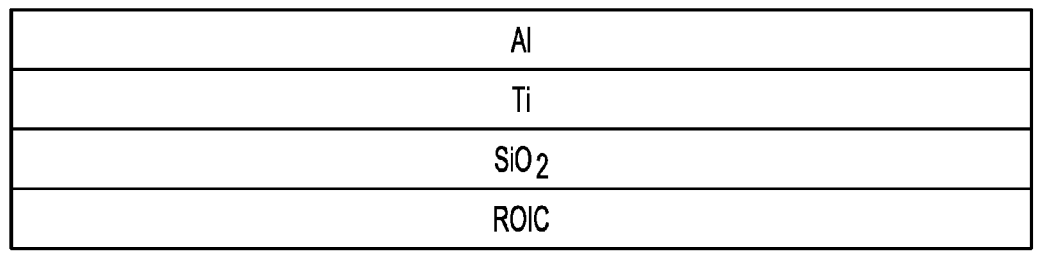
Figure 11F:
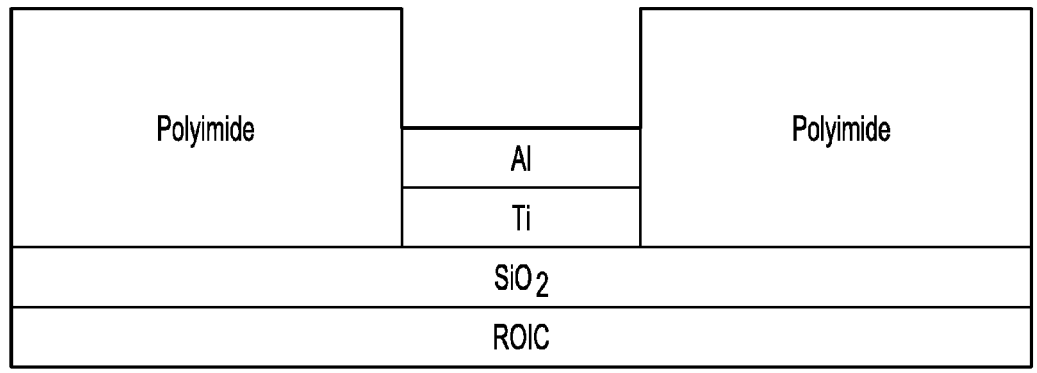
Figure 11G:
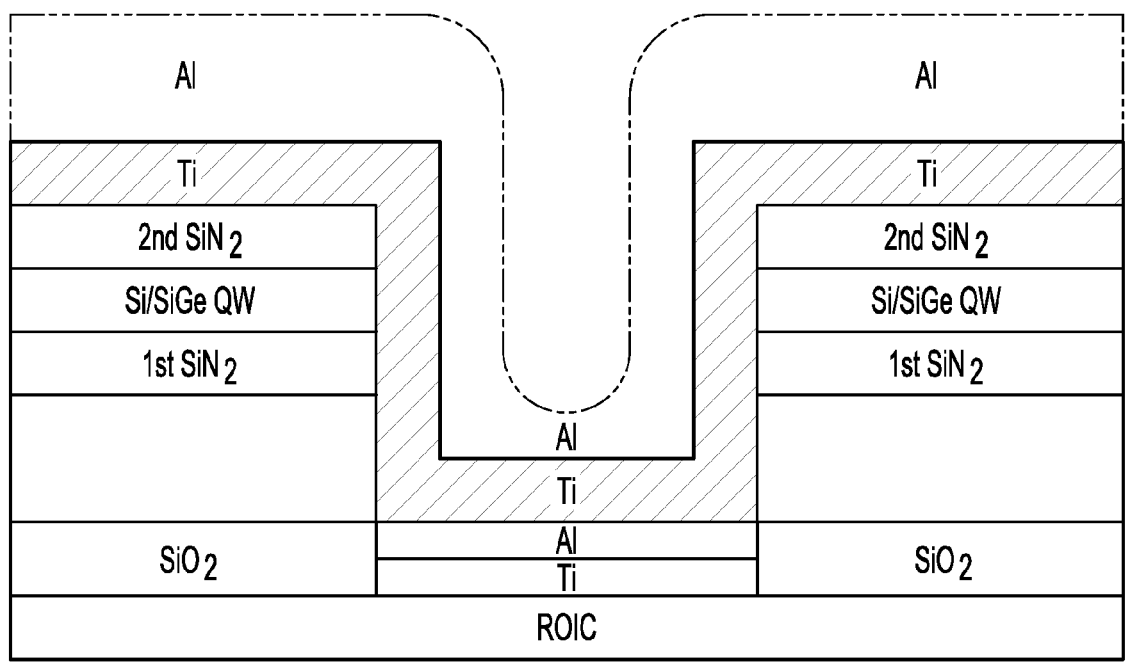

In operation 128, a thin metal film is deposited over the second layer of silicon nitride and the third layer of silicon nitride on the absorber 12. The thin metal film is configured to enhance IR absorption (see FIG. 11E).

In operation 130, a portion of the second and third layers of silicon nitride and the alternating layers of Si and SiGe (e.g., n-type or p-type) are removed down to the polyimide to form the thermopile arms.

In operation 132, the portions of the thin metal film, the first, second, and third layers of silicon nitride, and the alternating layers of Si and Si/Ge are removed on the arms 14, 15 to define an opening for forming the posts 22, 30.

In operation 134, titanium and aluminum are deposited in the openings formed within the arms 14, 15. The titanium and the aluminum are deposited within the openings to form the posts 22, 30. Only titanium is deposited over the absorber region. This section of the detector 10 is also known as active region 40 on the absorber 12.

In operation 136, the entire polyimide layer is removed with an oxygen plasma dry etch. By removing the entire polyimide layer, the first and second layers of the silicon nitride and the alternating layers of Si and SiGe are suspended over the substrate 16. The suspended layers of silicon nitride and Si and SiGe are coupled to the ROIC 19 via the posts 22, 30.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An infrared (IR) sensor comprising:
  a thermopile including:
    a substrate;
    an absorber being positioned above the substrate and forming a gap thereof, the absorber being arranged to receive IR from a scene and to generate an electrical output indicative of a temperature of the scene, the absorber being formed of a superlattice quantum well structure including a plurality of alternating first and second layers such that the absorber is thermally isolated from the substrate;
    a first encapsulating layer;
    a second encapsulating layer, the plurality of alternating first and second layers being positioned between the first encapsulating layer and the second encapsulating layer to support the absorber over the gap; and
    a first arm positioned on a first side of the absorber and a second arm positioned on a second side of the absorber, wherein the first arm is formed of a first superlattice quantum well structure and the second arm is formed of a second superlattice quantum well structure such that the absorber is thermally isolated by the first arm and the second arm.

2. The sensor of claim 1 wherein a total number of the plurality of alternating first layers and second layers is 8 to 10 layers.

3. The sensor of claim 1 wherein each of the first layers comprise silicon and each of the second layers comprise silicon germanium.

4. The sensor of claim 1 wherein each of the first and the second encapsulating layers comprise one of silicon nitride and silicon dioxide to stress compensate the plurality of alternating first and second layers.

5. The sensor of claim 1 wherein the first superlattice quantum well structure of the first arm and the second superlattice quantum well structure of the second arm each comprise a plurality of alternating layers of silicon and silicon germanium.

6. The sensor of claim 5 wherein the silicon germanium in the first arm and the second arm is one of n-type doped and p-type doped, and wherein a doping concentration of the silicon germanium is between $5 \times 10^{18}$ and $5 \times 10^{19}$ atoms/cm$^3$.

7. The sensor of claim 5 wherein the plurality of alternating layers of silicon and silicon germanium is encapsulated by a first layer of one of silicon nitride and silicon dioxide and a second layer of one of the silicon nitride and the silicon dioxide to stress compensate the plurality of alternating layers.

8. The sensor of claim 1 wherein the plurality of alternating first and second layers is arranged to extend in a first plane and to enable the electrical output to flow along the first plane.

9. A sensing apparatus comprising:
a thermopile including:
a substrate;
an absorber positioned about the substrate, the absorber for receiving thermal energy from an external source;
a first arm positioned on a first side of the absorber and being formed of a first superlattice quantum well structure including a first plurality of alternating layers to thermally isolate the first arm; and
a second arm positioned on a second side of the absorber and being formed of a second superlattice quantum well structure including a second plurality of alternating layers to thermally isolate the second arm.

10. The apparatus of claim 9 further comprising:
a first encapsulating layer being positioned on a first side of the first plurality of alternating layers; and
a second encapsulating layer being positioned on a second side of the first plurality of alternating layers, the first encapsulating layer and the second encapsulating layer for supporting the first plurality of alternating layers.

11. The apparatus of claim 10 wherein the first encapsulating layer and the second encapsulating layer comprise one of silicon nitride and silicon dioxide to stress compensate the first plurality of alternating layers.

12. The apparatus of claim 9 further comprising:
a third encapsulating layer being positioned on a first side of the second plurality of alternating layers; and
a fourth encapsulating layer being positioned on a second side of the second plurality of alternating layers, the third encapsulating layer and the fourth encapsulating layer for supporting the second plurality of alternating layers.

13. The apparatus of claim 12 wherein the third encapsulating layer and the fourth encapsulating layer comprise one of silicon nitride and silicon dioxide to stress compensate the second plurality of alternating layers.

14. The apparatus of claim 9 wherein the first plurality of alternating layers is n-type and the second plurality of alternating layers is p-type.

15. The apparatus of claim 9 wherein the first plurality of alternating layers is arranged to extend in a first plane and to enable an electrical signal to flow along the first plane.

16. The apparatus of claim 9 wherein the second plurality of alternating layers is arranged to extend in a first plane and to enable an electrical signal to flow along the first plane.

17. A sensing apparatus comprising:
a thermopile for providing an electrical signal indicative of thermal energy, the thermopile including:
a substrate;
an absorber positioned about the substrate, the absorber for receiving thermal energy from an external source to provide the electrical signal; and
a first arm positioned on a first side of the absorber and being formed of a first superlattice quantum well structure including a first plurality of alternating layers that is arranged to extend in a first plane and to enable flow of the electrical signal along the first plane.

18. The sensing apparatus of claim 17 further comprising a second arm positioned on a second side of the absorber and being formed of a second superlattice quantum well structure including a second plurality of alternating layers that is arranged to extend in the first plane and to enable flow of the electrical signal along the first plane.

19. The sensing apparatus of claim 18 wherein the absorber includes a third superlattice quantum well structure including a third plurality of alternating layers that is arranged to extend in the first plane and to enable flow of the electrical signal along the first plane.

20. The sensing apparatus of claim 18 further comprising:
a first encapsulating layer being positioned on a first side of the second plurality of alternating layers; and
a second encapsulating layer being positioned on a second side of the second plurality of alternating layers, the first encapsulating layer and the second encapsulating layer to support the second plurality of alternating layers.

21. The sensing apparatus of claim 20 wherein the first encapsulating layer and the second encapsulating layer comprise one of silicon nitride and silicon dioxide to stress compensate the second plurality of alternating layers.

22. The sensing apparatus of claim 17 further comprising:
a first encapsulating layer being positioned on a first side of the first plurality of alternating layers; and
a second encapsulating layer being positioned on a second side of the first plurality of alternating layers, the first encapsulating layer and the second encapsulating layer to support the first plurality of alternating layers.

23. The sensing apparatus of claim 22 wherein the first encapsulating layer and the second encapsulating layer comprise one of silicon nitride and silicon dioxide to stress compensate the first plurality of alternating layers.

24. A sensing apparatus comprising:
a thermopile to provide an electrical signal indicative of thermal energy, the thermopile including:
a substrate;
an absorber positioned about the substrate, the absorber to receive thermal energy from a source to provide the electrical signal, the absorber being formed of a superlattice quantum well structure including a first plurality of alternating layers that is arranged to extend in a first plane and to enable flow of the electrical signal along the first plane; and
a first arm positioned on a first side of the absorber and being formed of a first superlattice quantum well structure including a first plurality of alternating layers that is arranged to extend in the first plane and to enable flow of the electrical signal along the first plane.

25. The sensing apparatus of claim 24 further comprising a second arm positioned on a second side of the absorber and being formed of a second superlattice quantum well structure including a second plurality of alternating layers to extend in the first plane and to enable flow of the electrical signal along the first plane.

26. A method for forming a sensing apparatus, the method comprising:
forming a substrate:
forming an absorber, the absorber for receiving thermal energy from an external source;
forming a first arm on a first side of the absorber with a first quantum well structure including a plurality of first plurality of alternating layers; and
forming a second arm on a second side of the absorber with a second quantum well structure including a second plurality of alternating layers.

27. The method of claim 26 further comprising:
forming a first encapsulating layer on a first side of the first plurality of alternating layers; and
forming a second encapsulating layer on a second side of the first plurality of alternating layers to support the first plurality of alternating layers.

28. The method of claim 27 further comprising:
forming a third encapsulating layer on a first side of the second plurality of alternating layers; and
forming a fourth encapsulating layer on a second side of the second plurality of alternating layers to support the second plurality of alternating layers.

* * * * *